United States Patent [19]
Kitano et al.

[11] Patent Number: 5,944,894
[45] Date of Patent: Aug. 31, 1999

[54] SUBSTRATE TREATMENT SYSTEM

[75] Inventors: Junichi Kitano, Kofu; Takayuki Katano, Nirasaki; Keiko Kanzawa, Yamanshi-ken; Masami Akimoto; Norio Semba, both of Kumamoto, all of Japan

[73] Assignee: Tokyo Electron Limited, Tokyo, Japan

[21] Appl. No.: 08/917,734

[22] Filed: Aug. 27, 1997

[30] Foreign Application Priority Data

Aug. 29, 1996 [JP] Japan .................................. 8-247260

[51] Int. Cl.⁶ ............................ B05B 1/28; B01D 47/06; B05C 11/00; F27B 5/04

[52] U.S. Cl. ............................ 118/326; 118/300; 118/69; 96/244; 96/228; 96/417; 96/234; 96/408; 432/198; 432/201

[58] Field of Search ..................................... 118/326, 300, 118/69, 64, 58; 96/243, 244, 251, 265, 397, 417–419, 228, 229, 234, 408; 55/DIG. 46; 432/51, 52, 99, 198, 200, 201; 261/115, 117

[56] References Cited

PUBLICATIONS

Yukio Manabe et al., "The development of Air Purifing Technique by a Nucleation and Condensation Method", Journal of The Society of Powder Technology Japan, vol. 31 No. 6 (1994), pp. 409–415.(With English Abstract).

*Primary Examiner*—David A. Simmons
*Assistant Examiner*—Calvin Padgett
*Attorney, Agent, or Firm*—Oblon, Spivak, McClelland, Maier & Neustadt, P.C.

[57] ABSTRACT

A substrate treatment system comprises process sections provided with at least either of liquid treatment group units and heat treatment group units, an upper space formed above the process sections in order to supply air to the process sections, a purification section for removing alkaline components from the air to be supplied to the upper spaces to purify the air, temperature/humidity controller communicating with the urification section and the upper spaces to control the temperature and humidity of the air passing through the purification sections, and fans for supplying air to the top spaces from the temperature/humidity controller, lowering the air from the upper spaces into the process sections, and supplying at least some of the air lowering through the process sections to the temperature/humidity controller.

19 Claims, 10 Drawing Sheets

SUBSTRATE TREATMENT SYSTEM

BACKGROUND OF THE INVENTION

The present invention relates to a substrate treatment system provided with an air conditioning function for controlling the treatment environment of a semiconductor wafer or an LCD substrate.

In the photolithography process for fabricating a semiconductor device, photoresist is applied to a semiconductor wafer, the applied resist is pattern-exposed, the pattern-exposed resist is developed, and the developer is washed away with water. A series of these treatments is performed in an air-conditioned resist treatment system in a clean room.

A conventional resist treatment system has a fan filter unit (FFU) constituted by integrating a fan with a filter on its upper side. In the FFU, particles contained in air are removed and clean air is downflow-supplied toward each treatment unit. Moreover, a chemical filter is set to the upstream side of the FFU and thereby, organic components and ions contained in air are removed.

Recently, the so-called chemically-amplifying-type resist is frequently used in a photolithography process. The chemically-amplifying-type resist easily reacts on a very small amount of alkaline component such as ammonia contained in air. When the chemically-amplifying-type resist reacts on ammonia, a neutralization layer is formed. Because the neutralization layer is not easily dissolved by a developer, a designed pattern circuit is not formed. Therefore, it is necessary to lower the ammonia concentration of the air to be supplied to a process section up to a harmless level. However, the chemical filter has a short element service life and therefore, a filter element must be frequently replaced, the serviceability ratio of the system is lowered. The running cost is increased since it is necessary to periodically measure the ammonia concentration and estimate the life of the chemical filter element. Furthermore, the chemical filter is expensive.

BRIEF SUMMARY OF THE INVENTION

It is an object of the present invention to provide a substrate treatment system capable of efficiently removing a very small amount of alkaline components contained in air without using a chemical filter and having a long service life.

A substrate treatment system of the present invention is a substrate treatment system for treating a substrate under an air-conditioned environment, comprising; a process section provided with at least either of a liquid treatment system unit for treating the substrate with a treatment solution and a heat treatment system unit for heating and cooling the substrate; an upper space formed above the process section to supply air to the process section; a purification section for removing alkaline components from air to be supplied to the upper space and purifying the air; a temperature and humidity control section communicating with the purification section and the upper space to control the temperature and humidity of the air passing through the purification section; and air supply means for supplying air to the upper space from the temperature and humidity control section, lowering the air into the process section from the upper space, and supplying at least some of the air lowering through the process section to the temperature and humidity control section; wherein the purification section includes a chamber communicating with the outside of the system, air replenishment means for introducing a supplementary air into the chamber from the outside of the system, a nozzle for spraying an impurity removing liquid into the chamber, a gas-liquid contact section formed in the chamber in order to bring the sprayed impurity removing liquid into contact with the introduced supplementary air, and a mist trap mechanism set at the downstream side of the gas-liquid contact section to capture a mist-like impurity removing liquid contained in the supplementary air passing through the gas-liquid contact section.

It is preferable that air is introduced into the chamber by the air supply means from the lower side of the gas-liquid contact section and the impurity removing liquid is sprayed into the chamber through the nozzle from the upper side of the gas-liquid contact section. Thus, the mist-like impurity removing liquid counter-flow-contacts the supplementary air at the gas-liquid contact section and alkaline components are removed from the supplementary air at a high efficiency.

It is possible to spray the impurity removing liquid into the chamber through the nozzle from the lateral of the gas-liquid contact section. Thereby, the mist-like impurity removing liquid intersection-flow-contacts the air at the gas-liquid contact section and alkaline components are removed from the air.

It is preferable that the purification section is provided with a plurality of gas-liquid contact sections vertically arranged as a multiple stage. Moreover, it is possible that the purification section has one gas-liquid contact section.

The gas-liquid contact section is set so as to face the nozzle, stores the impurity removing liquid sprayed from the nozzle, and has a holed tray for rectifying the flow of the supplementary air introduced into the chamber.

The gas-liquid contact section Preferably has a solid member with an impurity removing liquid attached on their surface and forming small clearances between the materials through which air can pass. In this case, it is preferable to use a scrubbing brush-like shape synthetic fiber assembly or plural ceramic balls as the solid member. When air inertia-collides with the solid member, particles, ions, and alkaline components are easily captured by the impurity removing liquid attached on a surface of the solid member.

The air supply means preferably has a first fan for replenishing air from the outside of the system, a second fan for returning 60 to 70 vol % of the air flowing through the process section to the process section, and a mixing box for mixing the supplementary air with the returned air. By returning 60 to 70 vol % (approx. ⅔) of the air to the process section and replenishing 30 to 40 vol % (approx. ⅓) of the supplementary air from the outside of the system, the load of the purification section is decreased.

The system is preferably provided with a concentration sensor for detecting the alkaline-component concentration of the air supplied to the process section from the upper space and a control section for controlling the operations of the air supply means and air replenishment means so that the alkaline-component concentration of the air supplied to the process section from the upper space is decreased in accordance with a detection signal sent from the concentration sensor.

Furthermore, it is preferable that the system is provided with an alkaline-component removing unit for removing alkaline components from the solution remaining at the bottom of the chamber of the purification section, a concentration sensor for detecting the alkaline-component concentration of the solution remaining at the bottom of the chamber of the purification section, a solution supply source for supplying an impurity removing liquid to the nozzle, and a control section for controlling the operations of the solution supply source and alkaline-component removing unit in accordance with a detection signal sent from the concentration sensor.

Furthermore, it is preferable to use demineralized water with a temperature of 80° C. or lower and an ammonia concentration of less than 1 ppb as the impurity removing solution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

DETAILED DESCRIPTION OF THE INVENTION

Various preferred embodiments of the present invention are described below by referring to the accompanying drawings. In the case of these embodiments, a case is described in which the present invention is used for a coating and developing system for applying chemically-amplifying-type resist to a semiconductor wafer and developing the resist.

Figure 1:
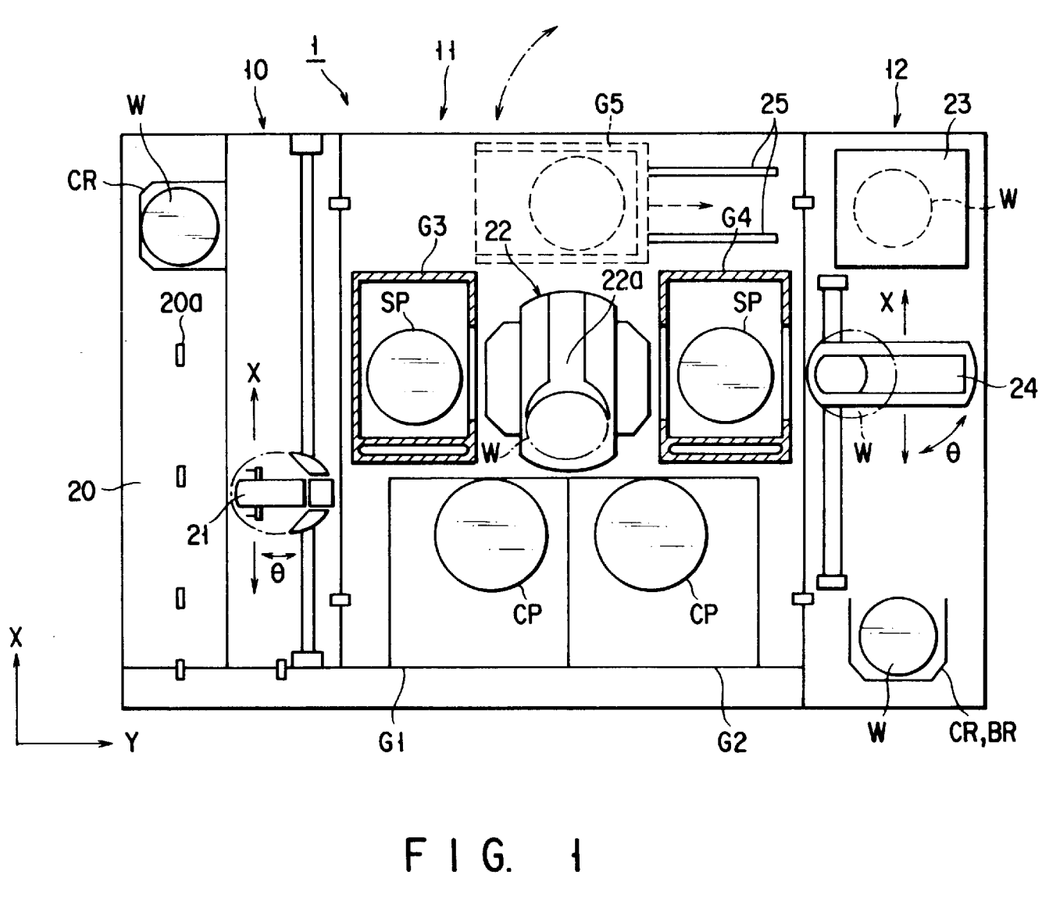
FIG. 1 is a perspective top view showing the outline of a substrate treatment system.
Figure 2:
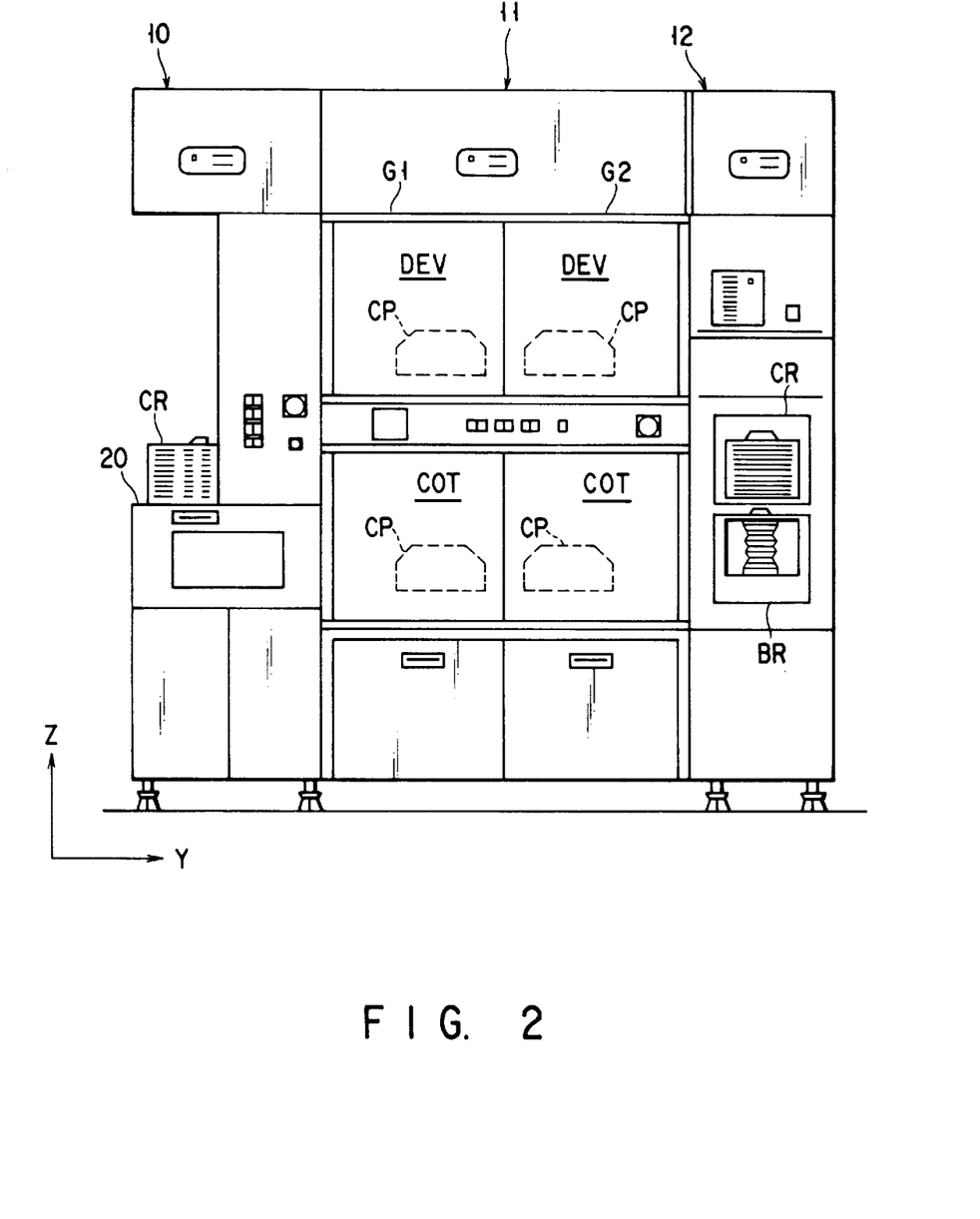
FIG. 2 is a full view showing the outline of a substrate treatment system.

As shown in FIGS. 1 and 2, a coating and developing system 1 comprises a cassette station 10, a process station 11, an interface section 12, two subarm mechanisms 21 and 24, and a main arm mechanism 22, and it is set in an air-conditioned clean room.

The cassette station 10 is provided with a cassette mounting table 20 so that a plurality of cassettes CR are mounted on the cassette mounting table 20. Wafers W of one lot are stored in the cassettes CR. One lot includes 25 or 13 wafers. The wafers W are taken out of the cassettes CR by the first subarm mechanism 21 and brought into the process station 11.

As shown in FIG. 1, the process station 11 is provided with five treatment unit groups $G_1$ to $G_5$. The treatment units of each of the groups $G_1$ to $G_5$ are vertically arranged as a multiple stage and wafers W are brought in or out by the main arm mechanism 22 one by one. The interface section 12 is set between the process station 11 and an aligner (not illustrated). Each wafer W is brought into or out of the aligner by the subarm mechanism 24.

Four protrusions 20a are formed on the cassette mounting table 20 so that the cassettes CR are positioned on the mounting table 20 by the protrusions 20a. A lid 44 is set to each cassette CR to be brought into the cassette station 10. Each cassette CR is placed on the mounting table 20 by turning its lid 44 toward the process station 11.

The process station 11 is provided with five treatment unit groups $G_1$, $G_2$, $G_3$, $G_4$, and $G_5$. The first and second treatment unit groups $G_1$ and $G_2$ are arranged at the front side of the system, the third treatment unit group $G_3$ is set adjacently to the cassette station 10, the fourth treatment unit group $G_4$ is set adjacently to the interface section 12, and the fifth treatment unit group $G_5$ is set to the back side.

The main arm mechanism 22 is provided with a driving mechanism for moving an arm 22a in X, Y, and Z axes and a driving mechanism for rotating the arm 22a about Z axis up to an angle of θ. When the main arm mechanism 22 receives the wafers W from the first subarm mechanism 21, it transfers the wafers W to an alignment unit (ALIM) and an index unit (EXT) included in the third treatment unit group $G_3$ in the process station 11.

As shown in FIG. 2, in the case of the first treatment unit group $G_1$, two spinner-type treatment units for mounting a wafer W on a spin chuck in a cup CP and performing a predetermined treatment, for example, a resist coating unit (COT) and a developing unit (DEV) are superposed in two stages from the bottom in order. Also in the case of the second treatment unit group $G_2$, two spinner-type treatment units, for example, a resist coating unit (COT) and a developing unit (DEV) are superposed in two stages from the bottom in order. It is preferable to arrange these resist coating units (COT) at the bottom stage so that waste liquid is easily discharged.

Figure 4:
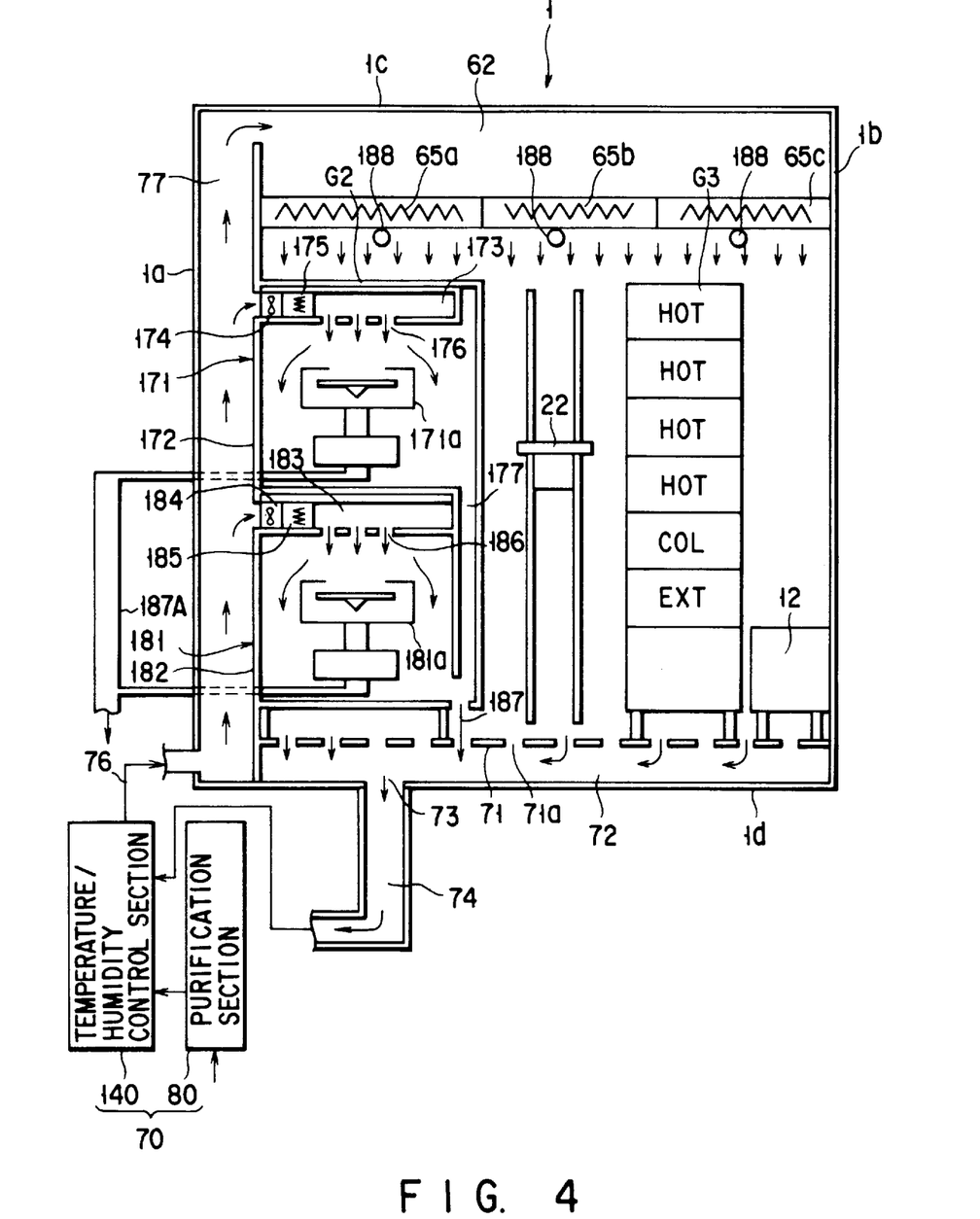
FIG. 4 is a block sectional view showing the circulation route of clean air in a substrate treatment system.

As shown in FIG. 4, in the case of the third treatment unit group $G_3$, an extension unit (EXT), a cooling unit (COL), and a hot unit (HOT) are superposed from the bottom in order. Also in the case of the fourth treatment unit group $G_4$, an adhesion unit (AD), a cooling unit (COL), an extension and cooling unit (EXTCOL), an extension unit (EXT), a cooling unit (COL), a pre-baking unit (PREBAKE), and a post-baking unit (POBAKE) are superposed from the bottom in order.

Thus, by arranging a cooling unit (COL) and an extension and cooling unit (EXTCOL) having a low treatment temperature in the bottom area and a hot unit (HOT), a pre-baking unit (PREBAKE), and a post-baking unit (POBAKE), in the upper area, the thermal mutual interference between treatment units is reduced.

The interface section 12 is almost the same as the process station 11 in X-axis directional size but it is smaller than the process station 11 in Y-axis directional size. Movable pickup cassettes CR and fixed buffer cassettes BR are arranged in two stage at the front of the interface section 12, a peripheral aligner 23 is set to the back of the section 12, and moreover the second subarm mechanism 24 is set to the central portion of the section 12. The second subarm mechanism 24 has an X structure same as that of the first subarm mechanism 21 so that it can access an extension unit (EXT) included in the fourth treatment unit group $G_4$ and moreover access an adjacent wafer delivery table (not illustrated) at the aligner side.

Furthermore, in the case of the coating and developing system 1, the fifth treatment unit group $G_5$ can be arranged at the back of the main wafer transfer mechanism 22. The fifth treatment unit group $G_5$ can move in Y-axis direction along a guide rail 25. By moving the fifth treatment unit group $G_5$, a space for performing maintenance and inspection is secured from the back of the main arm mechanism 22.

Figure 3:
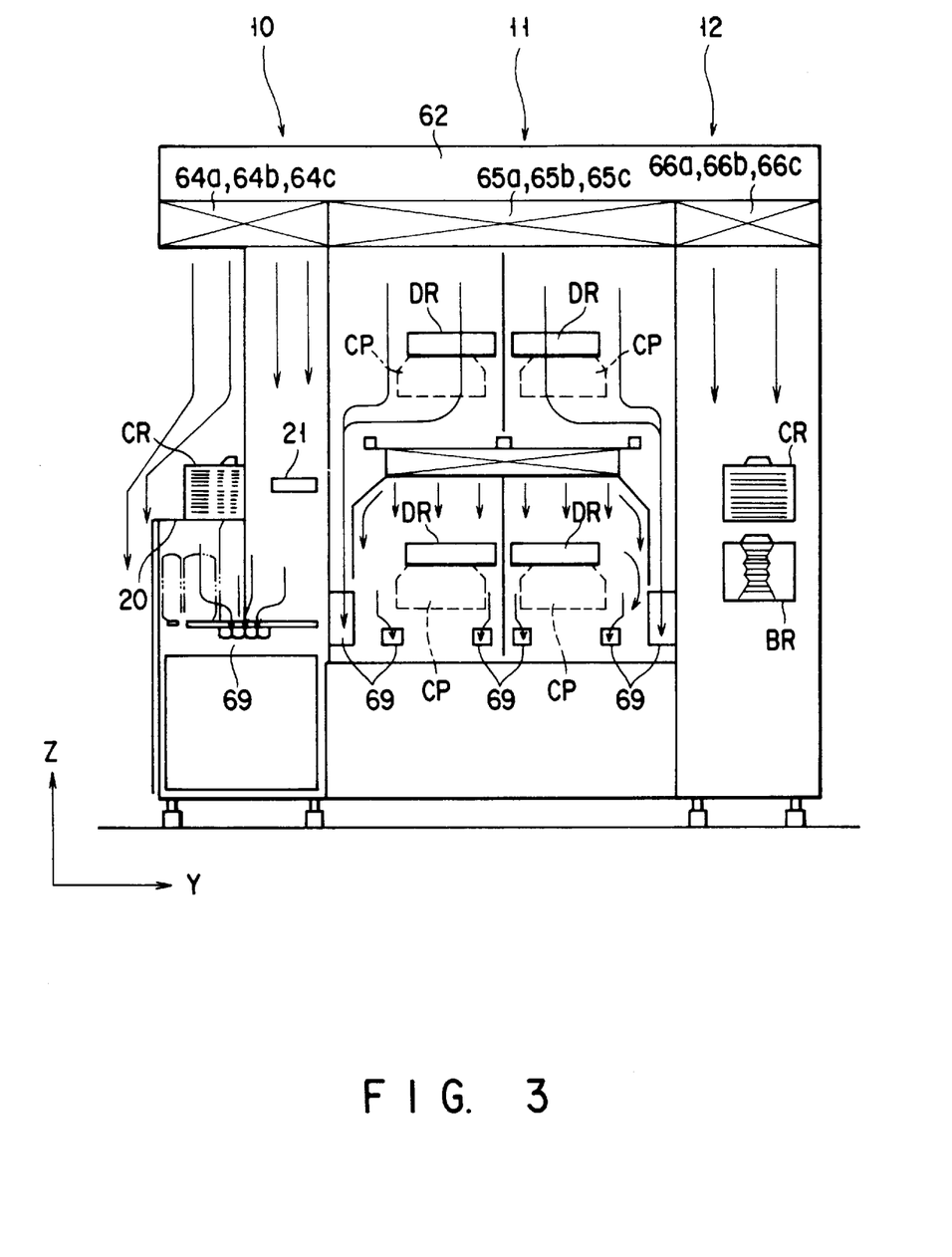
FIG. 3 is an internal perspective view schematically showing the flow of clean air in a substrate treatment system.

As shown in FIGS. 3 and 4, three filters 64a, 64b, and 64c are set on the cassette station 10, three filters 65a, 65b, and 65c are set on the process station 11, and three filters 66a, 66b, and 66c are set on the interface section 12. These filters 64a to 64c, 65a to 65c, and 66a to 66c have a upper space 62 in common. The top common space 62 communicates with a lower-side air conditioner 70 through a duct 77 so that clean air containing no ammonia is supplied to the common space 62 from the air conditioner 70. The clean air passes through the filters 64a to 64c, 65a to 65c, and 66a to 66c and is blown downward and thereby, the downflow of the clean air is formed on portions 10, 11, and 12.

Then, the circulation route of the clean air and the air conditioner 70 are described below by referring to FIGS. 4 to 7.

As shown in FIG. 4, the essential portion of the system 1 is enclosed by a side boards 1a and 1b, a top board 1c, and a bottom board 1d. A vertical duct 77 is formed between the side board 1a on one hand and chambers 172 and 182 of the liquid treatment system unit group $G_2$ on the other. A upper space 62 is formed between the top board 1c on one hand and the filters 64a to 64c, 65a to 65c, and 66a to 66c on the other. The upper space 62 communicates with the vertical duct 77. Moreover, a concentration sensor 188 is set immediately under the filters 65a, 65b, and 65c of the process section 11 respectively so that the ammonia concentrations of the air passing through the filters 65a, 65b, and 65c are detected.

A lower space 72 is formed between the bottom board 1d and a porous plate 71. A lot of air vents are formed on the porous plate 71 so that the downflow air in the system 1 enters the lower space 72 through a air vent 71a. The interface section 12 is provided nearby the extension unit (EXT) of the heat treatment system unit group $G_3$.

An exhaust port 73 communicating with an circulation passage 74 is formed on the bottom board 1d so that the air in the lower space 72 is supplied to a temperature and humidity control section 140 via the circulation passage 74.

The temperature and humidity of the air are controlled by the temperature and humidity control section 140 and supplied to the process section 11 again via the duct 77 and the upper space 62. Thus, some (approx. ⅓) of the downward flowing air is leaked out the system 1, and most (approx. ⅔) of the downward air is circulated into the system 1. Moreover, supplementary air is introduced into the inside of the system from the outside of it so as to replenish approx.

⅓ the total volume of air. Therefore, the system 1 can be referred to as a semi-closed system.

A resist coating unit 171 has a subchamber 173 on the main chamber 172. The subchamber 173 communicates with the vertical duct 77 so that clean air is directly introduced into the subchamber 173 from the duct 77. A small fan 174 and an HEPA filter 175 are set in the subchamber 173. Clean air is flown down into the main chamber 172 from a discharge port 176 through the filter 175. Moreover, the inside of the resist coating unit 171 communicates with an exhaust channel 177 and an exhaust port 187 of the exhaust channel 177 opens immediately above the porous plate 71. Further, the drain cup 17/a communicates with a collection exhaust line, not shown, on the plant side through an exhaust passage 187A.

A developing unit 181 also has a subchamber 183 on a main chamber 182. The subchamber 183 communicates with the vertical duct 77 so that clean air is directly introduced into the subchamber 183 from the duct 77. A small fan 184 and an HEPA filter 185 are set in the subchamber 183. Clean air is flown down into the main chamber 182 from a discharge port 186 through the filter 185. Moreover, the inside of the developing unit 181 communicates with the exhaust channel 177 and the exhaust port 187 of the exhaust channel 177 opens immediately above the porous plate 71. Further, the drain cup 181a communicates with the collection exhaust line, not shown, on the plant side through the exhaust passage 187A.

Thus, it is possible to form downflow air for the liquid treatment units 171 and 181 respectively and set the treatment-environment conditions (air speed, air flow, internal pressure, and air cleanliness) to a preferable value respectively. Therefore, it is possible to perform a desired treatment under preferable and stable conditions. Since a treatment environment is independently controlled for each treatment unit, the degree depending on a clean room is decreased in the environment control of treatment units and the load of the environment control of the clean room is reduced.

Moreover, because the air circulation duct 77 is adjoined to the liquid treatment system unit group $G_2$ and the group $G_2$ is set separately from the heat treatment system unit group $G_3$, circulation air does not easily receive thermal influence from the process section.

The above treatment system 1 removes alkaline components, organic components, and ions from air by the purification section 80, controls the temperature and humidity of the air by the temperature and humidity control section 140, and supplies the controlled air to the process section 11 through the duct 77, upper space 62, and filters 64a to 64c, 65a to 65c, and 66a to 66c. Therefore, it is possible to form a desired clean environment in the system 1 without using a chemical filter. In this case, mist-like demineralized water does not enter the system 1.

Figure 5:
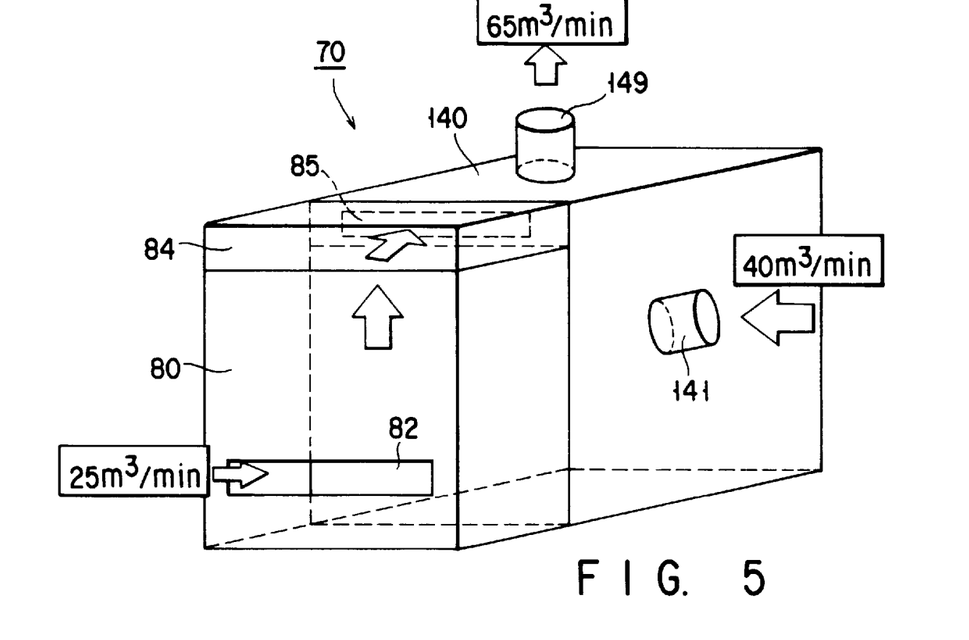
FIG. 5 is a schematic view showing the mass-flow balance of clean air in an air conditioner used for a substrate treatment system.

As shown in FIG. 5, the air circulation circuit of the system 1 is a semi-closed system which recovers approx. ⅔ of the air flown down from the process section 11, replenish the air (flow rate of 25 m³/min) newly introduced from the outside of the system to the recovered air (flow rate of 40 m³/min), and supplies the clean air with a total flow rate of 65 m³/min to the process section 1. Therefore, the system 1 makes it possible to greatly decrease the running cost because the system does not exhaust the total amount of air to the outside of the system but it circulates approx. ⅔ the total amount of the air through the process station 11.

Figure 6:
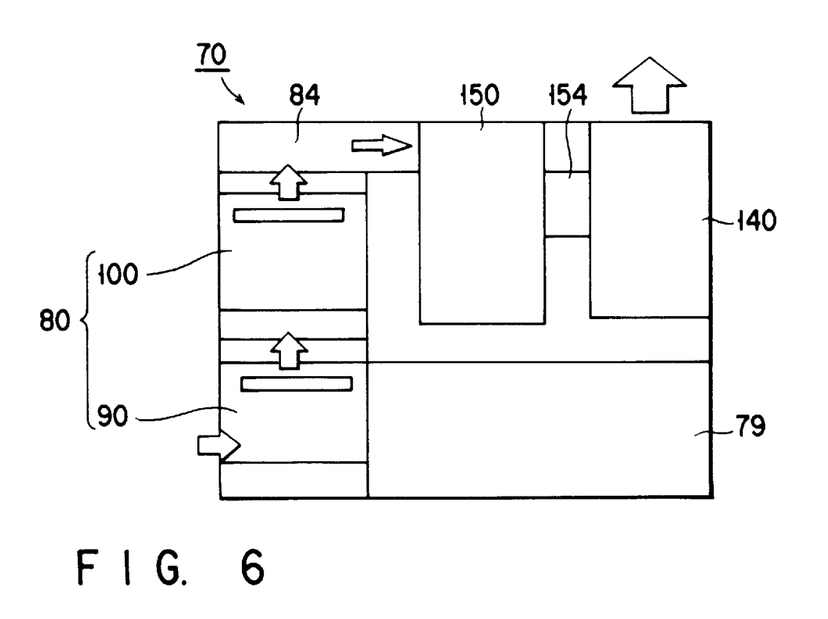
FIG. 6 is a block diagram showing the outline of the layout of each unit in an air conditioner.

Then, the air conditioner 70 is described below in detail by referring to FIGS. 6 and 7.

The air conditioner 70 is provided with a utility section 79, purification section 80, air supply section 150, temperature and humidity control section 140, and controller 170. The utility section 79 is provided with various heat exchangers (not illustrated), pumps (not illustrated), and refrigerators (not illustrated). Gas-liquid contact spaces 90 and 100 at top and bottom stages for bringing air into contact with sprayed demineralized water are formed on the purification section 80. The air supply section 150 is provided with two fans 151 and 152. The top space 84 of the purification section 80 communicates with the air supply section 150. The humidity control section includes a heater 142 and a humidifier 144. The air supply section 150 communicates with the temperature and humidity control section 140 through a mixing box 154.

Figure 7:
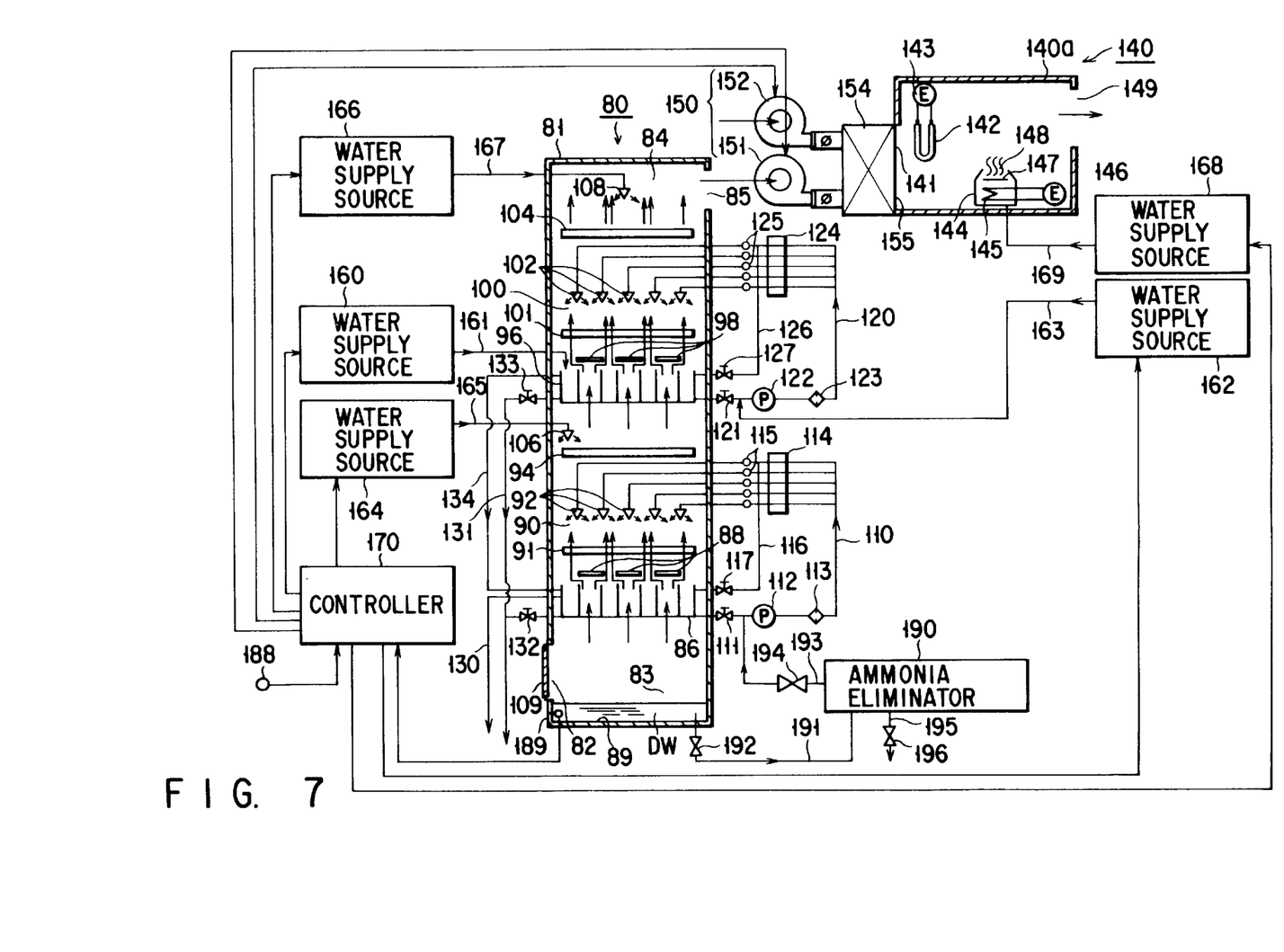
FIG. 7 is a block circuit diagram showing an air conditioner used for a substrate treatment system.

As shown in FIG. 7, the purification section 80 is provided with a chamber 81 extending in the Z-axis direction. A bottom aperture (entrance) 82 and a top aperture (exit) 85 are formed on the chamber 81, clean air is introduced into the bottom space 83 of the chamber 81 from a clean room through the entrance 82, and the air is exhausted from the stop space 84 of the chamber 81 through exit 85. A filter 109 is set to the entrance 82 so that particles are removed from newly introduced air.

A first-stage tray 86 is provided above the entrance 82 so that a certain amount of water is collected in the tray 86. A lot of air vents (not illustrated) are formed on the first-stage stray 86 and rectifying members 88 are set immediately above the air vents. The air rising from the lower side is rectified by these rectifying members 88. A drain line 130 communicating with an ammonia removing unit (ammonia eliminator) 190 is provided for the fist-stage tray 86 so that water with a high ammonia concentration is sent to the ammonia removing unit 190 from the first-stage tray 86 through the drain line 130.

A first mist separator 91 is set immediately above the first-stage tray 86. The mist separator 91 comprises a solid member formed scrubbing brush-like shape made of synthetic fiber and thereby, mist-like liquid components contained in air flow are captured. A number of first spray nozzles 92 are provided above the first mist separator 91 so that demineralized water is sprayed toward the separator 91. A gas-liquid contact section 90 is formed between these first spray nozzles 92 and the first mist separator 91. By bringing sprayed demineralized water with a temperature of approx. 7.7° C. into flow contact with air in the gas-liquid contact section 90, the concentration of ammonia is decreased from 100 ppb up to approx. 10 ppb as shown in Table 1.

The first spray nozzles 92 communicate with the liquid reservoir of the first-stage tray 86 through a circulation circuit 110 so that the demineralized water collected in the first-stage tray 86 is supplied to each nozzle 92. A valve 111, pump 112, filter 113, manifold 114, and flowmeter 115 are provided for the circulation circuit 110 from the upstream side in order. In the first circulation circuit 110, a bypass line 116 is set between the manifold 114 and the flowmeter 115.

A second mist separator 94 is set immediately above the first spray nozzles 92. The second mist separator 94 is substantially the same as the first mist separator 91. Moreover, a replenishment nozzle 106 is set immediately above the second mist separator 94 so that demineralized water with a temperature of approx. 8° C. is supplied to the nozzle 106 from a water supply source 164 through a line 165. Moreover, a second-stage tray 96 is set immediately above the second mist separator 94.

The second-stage tray 96 is set almost to the center of the height of the chamber 81 so that a certain amount of water is collected in the tray 96. A lot of air vents (not illustrated) are formed on the second-stage tray 96 and provided with rectifying members 98 immediately above the air vents. The air rising from the lower side is rectified by these rectifying members 98. Moreover, the second-stage tray 96 is provided with a replenishment line 161 so that demineralized water is replenished to the second-stage tray 96 from a water supply source 160 through the replenishment line 161. Moreover, the second-stage tray 96 is provided with a drain line 131 communicating with the ammonia removing unit 190 so that water with a high ammonia concentration is sent to the ammonia removing unit 190 from the second-stage tray 96 through the drain line 131. Furthermore, a bypass line 134 is set between the second-stage tray 96 and the first-stage tray 86 so that overflown water is supplied to the first-stage tray 86 from the second-stage tray 96 through the bypass line 134.

A third mist separator 101 is set immediately above the second-stage tray 96. The third mist separator 101 is substantially the same as the first mist separator 91. A lot of second spray nozzles 102 are set above the third mist separator 101 so that demineralized water is sprayed toward the third mist separator 101. The second gas-liquid contact section 100 is formed between these second spray nozzles 102 and the third mist separator 101. By bringing sprayed demineralized water with a temperature of approx. 7.7° C. into flow contact with air in the second liquid-gas contact section 100, the ammonia concentration of the air is decreased from 10 ppb up to less than 1 ppb as shown in Table 1.

The second spray nozzles 102 communicate with the liquid reservoir of the second-stage tray 96 through a circulation circuit 120 so that the demineralized water collected in the second-stage tray 96 is supplied to each nozzle 102. The circulation circuit 120 is provided with a valve 121, pump 122, filter 123, manifold 124, and flowmeter 125 from the upstream side in order. In the second circulation circuit 120, a bypass line 126 is set between the manifold 124 and the flowmeter 125.

A fourth mist separator 104 is set immediately above the second spray nozzles 102. The fourth mist separator 104 is substantially the same as the first mist separator 91. Moreover, a replenishment nozzle 108 is set immediately above the fourth mist separator 104 so that demineralized water with a temperature of approx. 8° C. is supplied to the nozzle 108 from a water supply source 166 through a line 167.

A drain pan 89 is formed at the bottom of the chamber 81 so that drain water DW is collected in the pan 89. The ammonia removing unit 190 communicates with the drain pan 89 through a recovery line 191. The ammonia removing unit 190 can use a chemical-type removing unit for removing ammonia component from the drain water DW by, for example, a neutralizer or a physical-type removing unit for removing ammonia component from the drain water DW by a reverse osmosis film. The ammonia component is removed from the drain water DW by the ammonia removing unit 190 and the drain water DW is reproduced into water with an ammonia concentration of 1 to 10 ppb.

A supply line 193 of the ammonia removing unit 190 communicates with the first circulation line 110 so that the reproduced water with a low ammonia concentration is supplied to the first spray nozzles 92 through the first circulation line 110. Because the drain water DW can be reproduced many times by the ammonia removing unit 190, it is possible to control the consumption of demineralized water used by the purification section 80.

Moreover, a drain line 195 of the ammonia removing unit 190 is released to the outside of the system so that water with a high ammonia concentration is discharged. Furthermore, a concentration sensor 189 is dipped in the drain water DW of the drain pan 89 so that the ammonia concentration of the drain water DW is detected. The concentration sensor 189 is connected to the input side of the controller 170 so that the controller 170 opens a valve 196 to discharge the water with a high ammonia concentration to the outside in accordance with concentration detection signal from sensor 189.

The air supply section 150 is provided with the first and second fans 151 and 152 and the mixing box 154. The intake port of the first fan 151 communicates with the exit 85 of the purification section 80 and its exhaust port 155 communicates with the mixing box 154. The intake port of the second fan 152 communicates with the branch pipe 75 and its exhaust port 141 communicates with the mixing box 154. The mixing box 154 includes a mixing circuit for completely mixing circulation air with fresh air. Though the system of this embodiment uses two fans 151 and 152 in order to mix circulation air with fresh air, it is also possible to use one fan having two intake ports instead of the two fans.

A chamber 140a of the temperature and humidity control section 140 communicates with the exit of the mixing box 154 so that the above mixed air is introduced into the chamber 140a. The heater 142 and the humidifier 144 are set in the chamber 140a. The heater 142 is connected to a power supply 143 and set nearby the air exhaust port 141. The air in the chamber 140a is heated by the heater 142 up to a temperature of approx. 23° C.

The humidifier 144 is provided with a heater 145, power supply 146, and evaporating dish 147. The heater 145 is connected to the power supply 146 so as to heat the evaporating dish 147. Demineralized water is supplied onto the evaporating dish 147 from a water supply source 168 through a line 169. When the evaporating dish 147 is heated by the heater 145, the demineralized water on the evaporating dish 147 is evaporated to produce water vapor 148. The water vapor 148 is added to the air in the chamber 140a so that the air with a humidity of approx. 40% goes out of the chamber 140a through an exit 149. As shown in FIG. 4, the exit 149 of the temperature and humidity control section 140 communicates with the duct 77 through the line 76.

Moreover, the controller 170 controls the operations of valves 111, 117, 121, 127, 132, 133, 192, 194, and 196, pumps 112 and 122, power supplies 143 and 146, fans 151 and 152, and water supply sources 160, 162, 164, 166, and 168.

The purification section 80 of the above embodiment is provided with two gas-liquid contact sections 90 and 100. However, the present invention is not restricted to the above case. It is also possible to use three or more gas-liquid contact sections. As the number of gas-liquid contact sections increases, the ammonia removal rate increases but the pressure loss also increases. Therefore, it is preferable to use two or three gas-liquid contact sections.

Table 1 shows measurement results of temperature, humidity, flow rate, and ammonia concentration of air at various portions of the air conditioner 70. In Table 1, position number 0 corresponds to the position of the line 75 at the upstream side of the purification section 80. Position number 1 corresponds to the position of the entrance 82 of the purification section 80. Position number 2 corresponds to the position of the rectifying member 88 of the first-stage tray 86. Position number 3 corresponds to the position of the first gas-liquid contact section 90. Position number 4 corresponds to the position of the second mist separator 94. Position number 5 corresponds to the position of the rectifying member 98 of the second-stage tray 96. Position number 6 corresponds to the position of the second gas-liquid contact section 100. Position number 7 corresponds to the position of the fourth mist separator 104. Position number 8 corresponds to the position of the intake port of the first fan 151 of the air supply section 150. Position number 9 corresponds to the position of the mixing box 154. Position number 10 corresponds to the position of the heater 142 of the temperature and humidity control section 140. Position number 11 corresponds to the position of the humidifier 144 of the temperature and humidity control section 140. Position number 12 corresponds to the position of the duct 77.

As shown in Table 1, the air at position numbers 0 and 1 has a temperature of 26° C., relative humidity of 35%, flow rate of 25 m$^3$/min, and ammonia concentration of 100 ppb, the air at position numbers 2 to 4 has a temperature of 16° C., relative humidity of 100%, flow rate of 25 m$^3$/min, and ammonia concentration of 10 ppb, the air at position numbers 5 to 7 has a temperature of 7.7° C., relative humidity of 100%, flow rate of 25 m$^3$/min, and ammonia concentration of less than 1 ppb, the air at position number 9 has a temperature of 19.5° C., relative humidity of 48%, flow rate of 70 m$^3$/min, and ammonia concentration of less than 1 ppb, and the air at position numbers 11 and 12 has a temperature of 23° C., relative humidity of 40%, flow rate of 70 m$^3$/min, and ammonia concentration of less than 1 ppb.

Table 2 shows measurement results of pressure losses at various portions of the air conditioner 70. Position numbers 1 to 9 in Table 2 correspond to those in Table 1 respectively. Pressure loss $\Delta P1$ shows 3.0 mmH$_2$O at position number 1, pressure loss $\Delta P2$ shows 1.4 mmH$_2$O at position numbers 2 to 5, pressure loss $\Delta P3$ shows 6.0 mmH$_2$O at position numbers 3 and 6 (downstream side), pressure loss $\Delta P4$ shows 2.4 mmH$_2$O at position numbers 3 and 6 (upstream side), pressure loss $\Delta P5$ shows 1.2 mmH$_2$O at position numbers 4 and 7, pressure loss $\Delta P6$ shows 7.5 mmH$_2$O at position number 8, and pressure loss $\Delta P7$ shows 39.5 mm at position number 9. Thus, because pressure loss is maximized at position number 9, it is preferable to use fans with a large capacity as the fans 151 and 152 of the air supply section 150.

TABLE 1

| Position No. | Process | Entrance | AIR Condition | | | |
|---|---|---|---|---|---|---|
| | | | Temp. | Humidity | Flow | NH$_3$ conc. |
| 0 | Initial | Entrance | 26 C. ° | 35% RH | 25 m$^3$/min | 100 ppb |
| 1 | Particle removal | | | | | |

TABLE 1-continued

| Position No. | Process | Entrance | AIR Condition Temp. | Humidity | Flow | NH₃ conc. |
|---|---|---|---|---|---|---|
| 2 | Rectification | First stage | 16 C. ° | 100% RH | 25 m³/min | 10 ppb |
| 3 | Removal by cold water spraying | | | | | |
| 4 | Mist removal | | | | | |
| 5 | Rectification | Second stage | 7.7 C. ° | 100% RH | 25 m³/min | <1 ppb |
| 6 | Removal by cold water spraying | | | | | |
| 7 | Mist removal | | | | | |
| 8 | Air supply | | | | | |
| 9 | Confluence with recovered air | MIXING | 19.5 C. ° | 48% RH | 70 m³/min | <1 ppb |
| 10 | Heating | Heater | 23 C. ° | | | |
| 11 | Humidification | Humidifier | | 40% RH | | |
| 12 | Duct supply | Duct Exit | 23 C. ° | 40% RH | 70 m³/min | <1 ppb |

TABLE 2

| Position No. | Pressure loss (mm H₂O) |
|---|---|
| 1 | ΔP1 = 3.0 |
| 2 | ΔP2 = 1.4 |
| 5 | |
| 3 | ΔP3 = 6.0 |
| 6 | |
| 4 | ΔP4 = 2.4 |
| 7 | |
| 8 | ΔP5 = 1.2 |
| 8 | ΔP6 = 7.5 |
| 9 | ΔP7 = 39.5 |

Then, another embodiment is described below by referring to FIGS 8 to 13.

Figure 8:
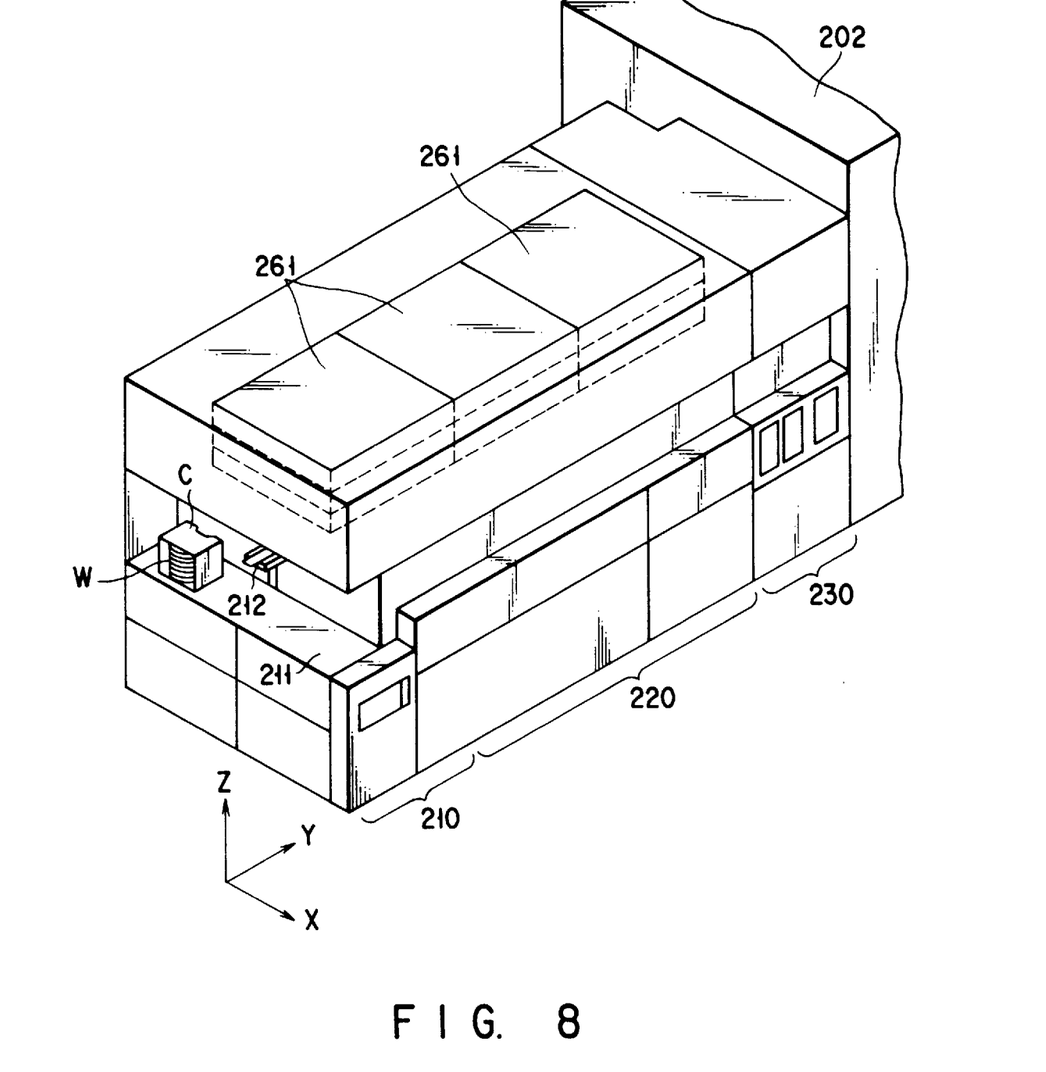
FIG. 8 is an appearance perspective view showing the outline of the substrate treatment system of another embodiment of the present invention.
Figure 9:
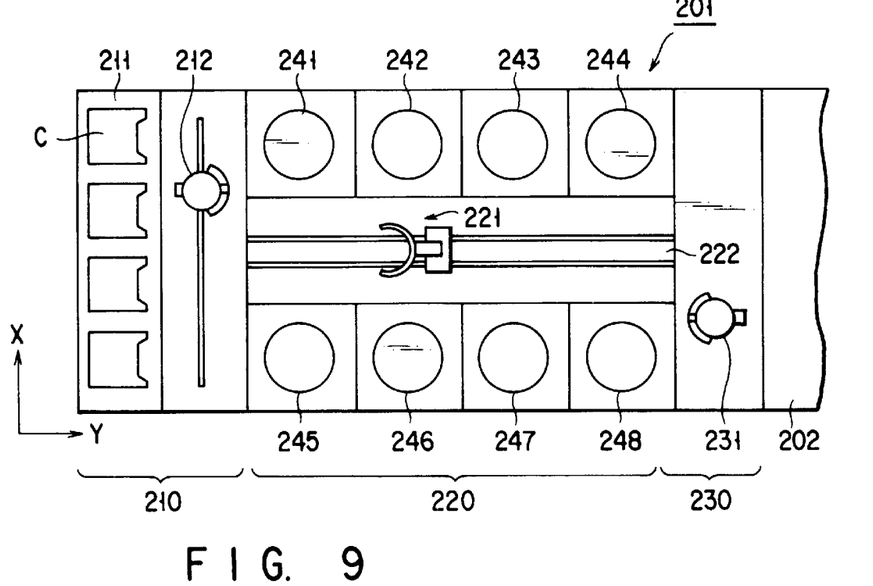
FIG. 9 is a perspective top view showing the outline of the inside of a substrate treatment system.
Figure 10:
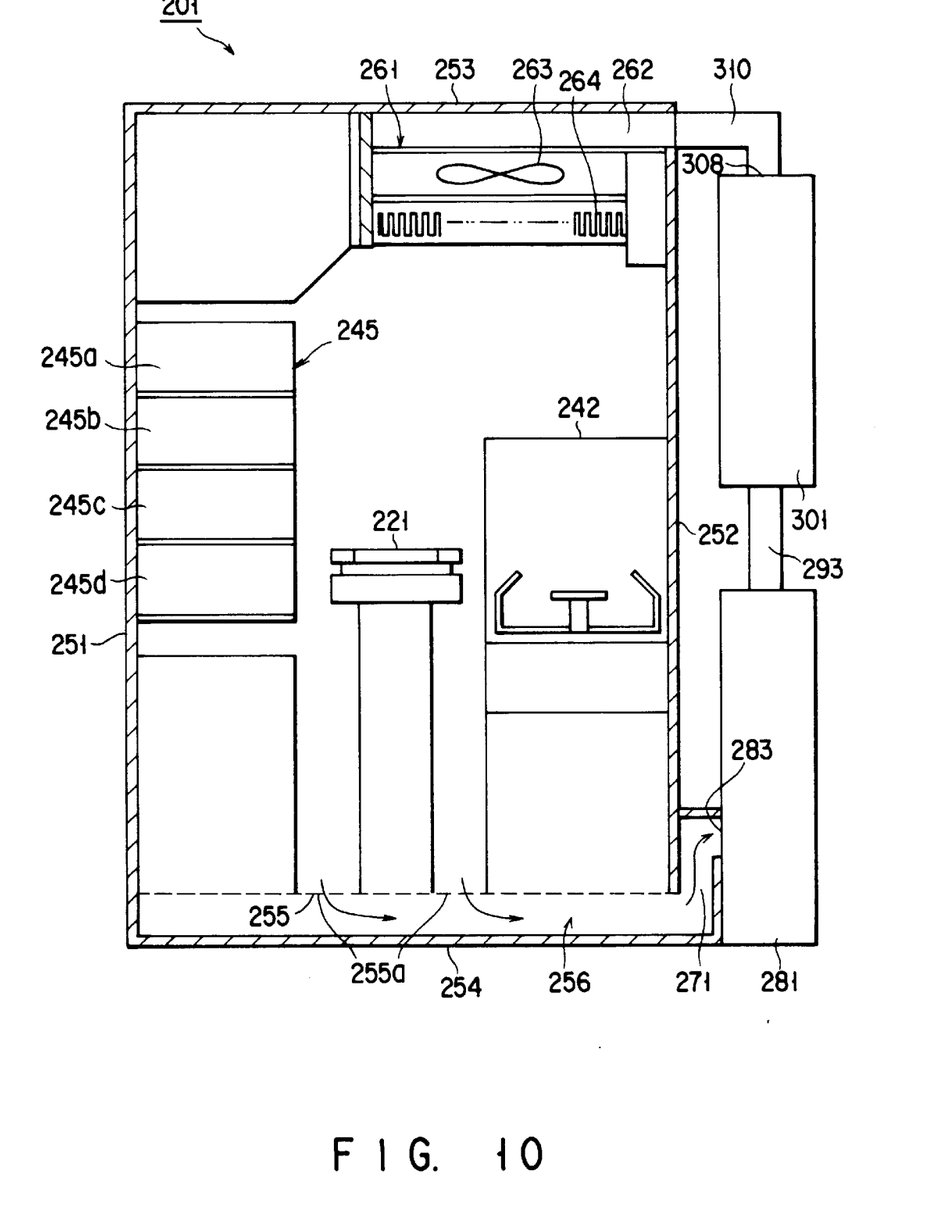
FIG. 10 is a cross-sectional block diagram showing the outline of the inside of a substrate treatment system.

As shown in FIGS. 8, 9, and 10, a substrate treatment system 201 is provided with a loading/unloading section 210, a process section 220, and an interface section 230. An exposure system 202 is adjacently set to the substrate treatment system 201 so that a wafer W is delivered between the systems 201 and 202 through the interface section 230.

The loading/unloading section 210 is provided with a cassette stage 211 and a subarm mechanism 212. Four cassettes C, for example, are mounted on the stage 211. The subarm mechanism 212 takes out the wafer W from a cassette C on the stage 211 and delivers the wafer W to the main arm mechanism 221 of the process section 220.

A transfer message 222 is provided for the center of the process section 220 and the main mechanism 221 is provided with a central transfer passage 222 in transfer direction. Pvarious treatment units 241 to 247 are arranged at the both sides of the central transfer passage 222. The liquid treatment system units 241 to 244 are provided for one side of the central transfer passage 222 and the heat treatment system units 245 to 248 are provided for the other side of the central transfer passage 222. The subunits of the heat treatment system units 245 to 248 are vertically superposed as a multiple stage. As shown in FIG. 10, in the case of the heat treatment system unit 245, for example, four subunits 245a, 245b, 245c, and 245d are vertically superposed as a multiple stage. Two subunits 245a and 245b from the top are provided with a heating plate for baking the wafer W. Two subunits 245c and 245d from the bottom are provided with a cooling plate for cooling the wafer W.

The treatment system 1 is a semi-closed system which is almost covered with outer cases 251, 252, 253, and 254 made of a stainless steel plate or corrosion-resistant resin panel and in which only a part of the loading/unloading section 210 opens toward the clean room.

FFUs (fan filter units) 261 respectively provided with a fan 263 and a ULPA filter 264 are set to the top of this treatment system 1 so that clean air is blown downward from each FFU 261. A ceiling chamber 262 is set immediately above each FFU 261 so that clean air is supplied into the ceiling chamber 262 from air conditioners 281 and 301. A floor board 255 made of a punching metal or grating material is set to the bottom of the system 1. A lower space 256 is formed between the floor board 255 and a bottom board 254 so that air enters the bottom space 255 through a lot of air vents 255a of the floor board 255. As shown in FIG. 10, air is collected in the lower space 256 and led to a first air introduction port 283 of the purification section 281 of an air conditioner through an exhaust channel 271.

Figure 11:
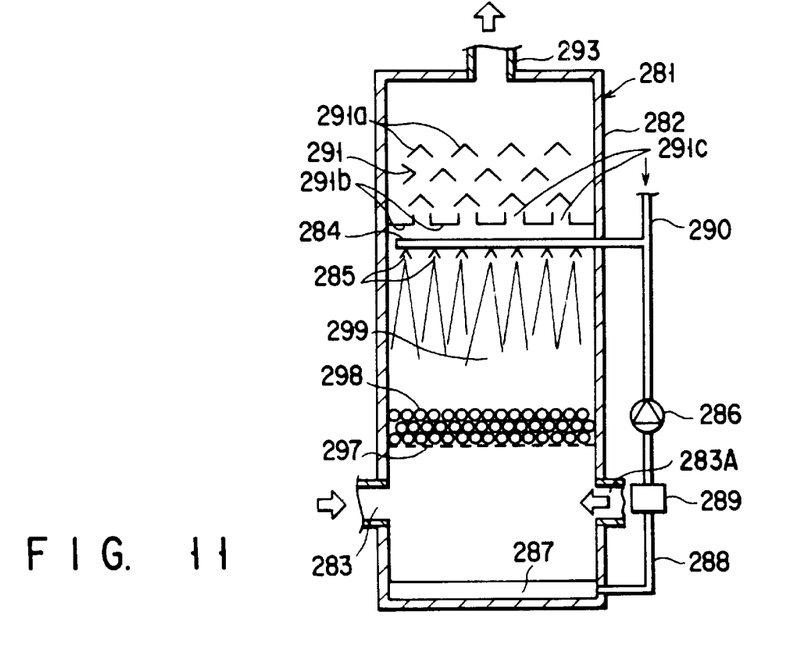
FIG. 11 is a perspective sectional view showing the outline of a purification unit of an air conditioner.

As shown in FIG. 11, the first air introduction port 283 and a second air introduction port 283A of the purification section 281 is set to the bottom of a casing 282. The first port 283 communicates with the lower space 256, and the second port 283A communicates with the atmosphere in the clean room. The air within the clean room is introduced by an air pump (not shown) into the casing 282 via the second port 283A. A ventilation plate 297, ceramic ball 298, horizontal header 284, spray nozzle 285, and eliminator 291 are set in the casing 282 from the bottom in order. An air exit 292 is formed at the top of the casing 282. The ventilation plate 297 comprises a punching metal made of stainless steel, a lot of ceramic balls 298 are arranged on the ventilation plate 297 and heads of the ceramic balls 298 are formed at a proper thickness.

A lot of spray nozzles 285 are downward set to the horizontal header 284 so that demineralize water is sprayed toward the head of each ceramic ball 298 from each nozzle 285. A space 299 for gas-liquid contact is formed between each spray nozzle 285 and the head of each ceramic ball 298. Air contacts sprayed water in this space 299 so that impurities are removed from the air. Not only the space 299 but also the head of each ceramic ball 298 serves as a gas-liquid contact section.

The horizontal header 284 communicates with a demineralized-water supply source (not illustrated) through a replenishment pipe 290 so that demineralized water is replenished to each nozzle 285. A circulation pipe 288 communicates with the replenishment pipe 290 so that the water in a drain pan 287 circulates through the header 284 via the circulation pipe 288. The circulation pipe 288 is provided with a pump 286 and a filter 289 so that the drain water DW is purified.

The eliminator 291 is set above the header 284. The eliminator 291 is provided with a multistage fin 291a and pan 291b. The fin 291a is zigzag arranged above the pan 291b. Mist collides with the fin 291a through the aperture of the pan 291b and gas and liquid separates from each other because liquid contained in the mist attaches to the fin 291a. The liquid captured by the eliminator 291 drops onto the drain pan 287 so that it is collected in the pan 287.

Because the head of the ceramic ball 298 is always moistened by demineralized water, particles, organic components, ions, and alkaline component (ammonia) are removed when introduced air passes through the head of the ceramic ball 298. The filtrated air is further purified in the gas-liquid contact space 299. Thus, the purifier 281 is constituted so that it can efficiently remove impurities from introduced air. Moreover, it is possible to directly inject demineralized water into the head of the ceramic ball 298.

Figure 12:
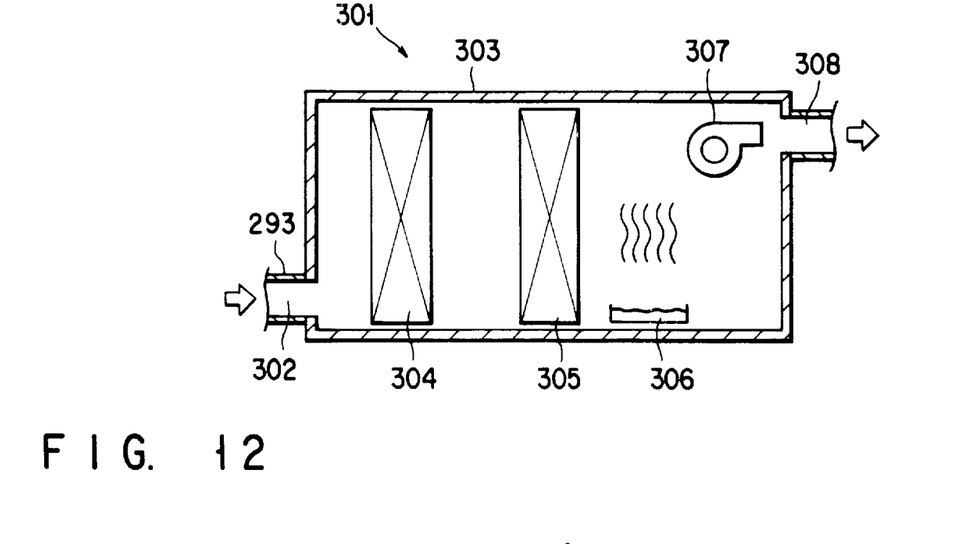
FIG. 12 is a perspective sectional view showing the outline of a temperature and humidity control unit of an air conditioner.

As shown in FIG. 12, the temperature and humidity control section 301 communicates with the purification section 281 through a communication pipe 293 so that air is introduced into the temperature and humidity control section 301 through an introduction port 302. A cooling mechanism 304, heating mechanism 305, and humidifying mechanism 306 are set in a chamber 303 of the temperature and humidity control section 301 from the upstream side in order.

The cooling mechanism 304 has functions for quickly cooling introduced air from room temperature up to approx. 5° C., condensing some of contained moisture, and reducing the relative humidity of the air. It is possible to use, for example, a cooling coil for the cooling mechanism 304. The heating mechanism 305 heats the cooled air up to a predetermined temperature. It is possible to use, for example, an electric heater or a heating coil using heat source water for the heating mechanism 305.

The humidifying mechanism 306 comprises an ultrasonic atomizer provided with an ultrasonic oscillator (not illustrated) and has a function for changing demineralized water into mist. By adding the mist of demineralized water produced by the humidifying mechanism 306 to air, the humidity of the air is adjusted. It is also possible to use a heating-and-evaporating-type humidifier for the humidifying mechanism 306. Air is sent from an outgoing port 308 toward the upper space 262 by a blower 307.

Recovered air is adjusted at the outgoing port 308 so that, for example, the temperature comes to 23° C. and the relative humidity comes to 40%. The operations of the cooling mechanism 304, heating mechanism 305, and humidifying mechanism 306 are respectively controlled by the controller 170.

Figure 13:
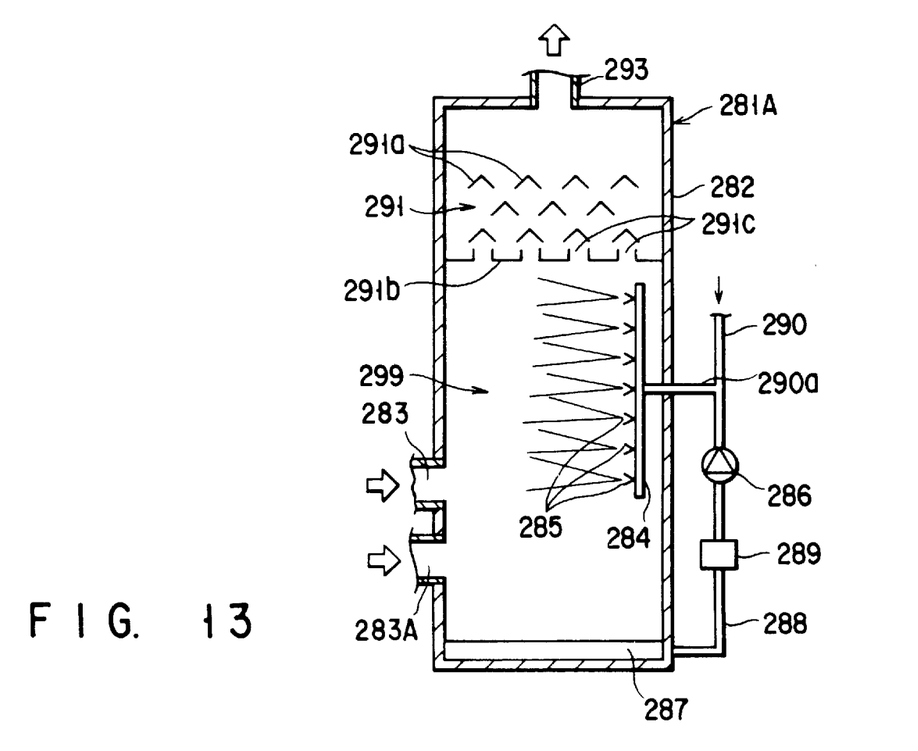
FIG. 13 is a perspective sectional view showing the outline of the purification unit of another embodiment.

FIG. 13 is an internal perspective schematic view showing a purification section 281A of another embodiment. The purification section 281A is provided with a vertical header 284A having a lot of spray nozzles 285. The vertical header 284A is set to one side of the gas-liquid contact space 299 so that demineralized water is sprayed from the nozzles 285 to the space 299 from one side to the other side. The vertical header 284A communicates with the replenishment pipe 290 through a branch pipe 290a so that demineralized water is supplied to each nozzle 285 form a demineralized water supply source (not illustrated). Moreover, the circulation pipe 288 communicates with the replenishment pipe 290 so that the water in the drain pan 287 is circulation-supplied to the header 284 through the circulation pipe 288. The circulation pipe 288 is provided with the pump 286 and the filter 289 so that drain water is purified.

It is also possible to connect the replenishment pipe 290 to the demineralized water supply line of the scrubber so as to replenish demineralized water into the purifier 281A. Thus, it is possible to effectively use the pure water line in the treatment system 1.

As shown in FIG. 10, the outgoing port 308 of the temperature and humidity control section 301 communicates with the upper space 262 of the treatment system 201 through a duct 310. Because the treatment system 201 is a semi-closed system, it uses circulation air obtained by newly replenishing fresh air to recovered air. It is also possible to take in fresh air from the apertures of the treatment system 201 or separately from other air conditioner (not illustrated).

Then, the outline of the operation of the above system is described below.

When the wafer cassette C is mounted on the stage 211 of the loader/unloader section 210, the subarm mechanism 212 takes the wafer W out of the cassette C and delivers it to the main arm mechanism 221. The main arm mechanism 221 transfers the wafer W to the adhesion unit 241 to adhesion-treat the wafer W. The wafer W is successively treated in accordance with a predetermined recipe.

In the treatment system 201 under resist treatment of the wafer W, clean air is blown out of the FFU 261 at a blowoff rate of 0.35 to 0.5 m/sec and downflow of the clean air is formed. Particles, organic components, ions, and alkaline components present in the system 201 are transferred to the floor side due to the downflow of the clean air and collected in the lower space 256 after passing through the air vent plate 255, and introduced into the purifier 281 through the lower space 256.

In the purifier 281, demineralized water is sprayed on introduced air and particles, organic components, ions, and alkaline components are removed. Moreover, moisture is separated from the air free from these foreign matters by the eliminator 291.

Thus, the air from which particles and the like are removed by the purifier 281 is introduced into the temperature and humidity controller 301 and its temperature and relative humidity are controlled to 23° C. and 40%, and thereafter sent to the upper space 262. Moreover, the introduced air passes through the HEPA filter 264 of the FFU 261 where the air is further purified and flown down in the system 201 again.

In the treatment system 201, approx. 99% of organic components, ions, and alkaline components is removed from air by purifier 281. Therefore, it is possible to form clean downflow in the system without using any expensive chemical filter. Moreover, to remove organic components, ions, and alkaline components, it is only necessary to spray demineralized water on the gas-liquid contact space 299 of purifier 281 and the spraying means has a simple structure. Moreover, foreign matters to be removed can be acid or alkaline. Furthermore, purified demineralized water can be recycled and the recycling cost is low. Furthermore, the maintenance and inspection cycle is lengthened than ever and as a result, the synthetic throughput is improved. Furthermore, when an existing demineralized water supply system is already used for the treatment system 201, the demineralized water supplied from the demineralized water supply system can be used as an impurity removing liquid in the purifier 281.

In the case of the gas-liquid-contact-type purification sections 281 and 281A, when circulating air containing mist-like moisture through the system 201, water drops may attach to the wafer W. However, the air containing mist-like moisture does not enter the system 201 because the mist-like moisture is captured by the eliminator 291 of the purification section, and then the air is heated by the temperature and humidity control section 301 and moreover controlled to a proper temperature and humidity. Furthermore, because mist-like moisture of the air is captured by the eliminator 291 and thereafter the air is introduced into the temperature and humidity control section 301, the load of the temperature and humidity control section 301 for air humidity control is reduced.

In the case of the above embodiments, the purification section 281 and the temperature and humidity control section 301 are set outside of the treatment system 201. However, the present invention is not restricted to the above case. It is also possible to set the sections 281 and 301 inside of the treatment system 201.

Moreover, the above embodiments use a resist coating and developing system. However, the present invention is not restricted to the above case. It is also possible to apply the present invention to a CVD film forming system, oxidation film forming system, and CMP (Chemical Mechanical Polisher). When using the CMP, it is permitted to treat the entire exhaust gas from the CMP by a purification section and a temperature and humidity control section and then return clean air into the circulation system of a clean room or into the clean room. Thus, the load of the cleanroom is reduced by treating air by the purification section and temperature and humidity control section of a substrate treatment system. Therefore, even when setting a lot of substrate treatment systems in a clean room, it is not necessary to increase the air conditioning capacity of the clean room. In the case of the above embodiments, a case is described in which a semiconductor wafer is used as a substrate to be treated. However, the present invention is not restricted to the above case. It is also possible to treat a glass substrate for an LCD.

The present invention makes it possible to efficiently remove alkaline components, particles, organic components, and ions without using any chemical filter. Moreover, because a system of the present invention has a service life longer than that of a conventional chemical filter, it is possible to lengthen the interval of maintenance and inspection and improve the serviceability of the system. Furthermore, the present invention makes it possible to efficiently use demineralized water serving as an impurity removing liquid in the entire system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A substrate treatment system for treating a substrate under an air-conditioned environment, comprising;

a process section provided with either of a group of liquid treatment units for treating the substrate with a treatment solution and a group of heat treatment units for heating and cooling the substrate;

an upper space formed above the process section to supply air to said process section;

a purification section for removing alkaline components from air to be supplied to said upper space and purifying said air;

a temperature and humidity control section communicating with said purification section and said upper space to control the temperature and humidity of the air passing through said purification section; and air supply means for supplying air to said upper space from said temperature and humidity control section, lowering the air into said process section from said upper space, and supplying at least some of the air lowering through said process section to said temperature and humidity control section; wherein said purification section includes
  a chamber communicating with the outside of said system,
  air replenishment means for introducing a supplementary air into said chamber from the outside of said system,
  a nozzle for spraying an impurity removing liquid into said chamber,
  a gas-liquid contact section formed in said chamber in order to bring said sprayed impurity removing liquid into contact with said introduced supplementary air, and
  a mist trap mechanism set at the downstream side of said gas-liquid contact section to capture a mist-like impurity removing liquid contained in the supplementary air passing through said gas-liquid contact section.

2. A system according to claim 1, wherein said supplementary air is introduced into the chamber from the lower side of the gas-liquid contact section by the air supply means, the impurity removing liquid is sprayed into said chamber by the nozzle from the upper side of said gas-liquid contact section, and thereby the mist-like impurity removing liquid counter-flow-contacts said supplementary air in said gas-liquid contact section and alkaline components are removed from said supplementary air.

3. A system according to claim 1, wherein said supplementary air is introduced into the chamber by the air supply means from the lower side of the gas-liquid contact section, the impurity removing liquid is sprayed into said chamber by the nozzle from the lateral of said gas-liquid contact section, and thereby the mist-like impurity removing liquid intersection-flow-contacts said supplementary air in said gas-liquid contact section and alkaline components are removed from said supplementary air.

4. A system according to claim 1, wherein
said purification section has a plurality of gas-liquid contact sections vertically arranged as a multiple stage.

5. A system according to claim 1, wherein
said purification section has one gas-liquid contact section.

6. A system according to claim 1, wherein
said gas-liquid contact section further comprises a holed tray which is set so as to face the nozzle, collects the impurity removing liquid sprayed from said nozzle, and rectify the flow of the supplementary air introduced into the chamber.

7. A system according to claim 1, wherein
said gas-liquid contact section further comprises solid member with an impurity removing liquid attached to their surface and forming gaps between them through which the air can circulate.

8. A system according to claim 7, wherein
said solid member is a scrubbing brush shaped synthetic fiber assembly or plural ceramic balls.

9. A system according to claim 1, wherein
said air supply means further comprises a first fan for replenishing the supplementary air from the outside of said system, a second fan for circulating 60 to 70 vol % of the air flowing through the process section to said process section, and a mixing box for mixing said supplementary air with said circulated air.

10. A system according to claim 1, further comprising,
a concentration sensor for detecting the alkaline-component concentration of air supplied from the upper space to the process section, and
a control section for controlling the operations of said air supply means and said air replenishment means so that the alkaline-component concentration of said air supplied from said upper space to said process section is decreased in accordance with a detection signal sent from said concentration sensor.

11. A system according to claim 1, further comprising,
an alkaline-component removing unit for removing alkaline components from a liquid collected at the bottom of the chamber of the purification section.

12. A system according to claim 11, further comprising,
a concentration sensor for detecting an alkaline-component concentration of a liquid collected at the bottom of the chamber of the purification section,
a liquid supply source for supplying an impurity removing liquid to the nozzle, and
a control section for controlling the operations of said liquid supply source and said alkaline-component removing unit in accordance with a detection signal sent from said concentration sensor.

13. A system according to claim 1, wherein
said temperature and humidity control section further comprises a container having an air entrance and an air exit, a heater set to the air entrance side to heat the air in said container, and a humidifier set to the air exit side to humidify the air in said container.

14. A system according to claim 13, wherein
a temperature and humidity control section further comprises a cooling mechanism set to position closer to said air entrance than to said heater to quickly cool the air in the container.

15. A system according to claim 1, wherein
said air supply means is set between said purification section and said temperature and humidity control section.

16. A system according to claim 1, further comprising,
a drain pan set to the lower side of the gas-liquid contact section, an alkaline-component removing unit for removing alkaline components from a liquid collected in said drain pan to purify the liquid, and a circulation circuit for returning said purified liquid to the nozzle.

17. A system according to claim 1, further comprising,
cleaning means for spraying a fresh impurity removing liquid on the mist trap mechanism to wash away a previously-captured impurity removing liquid from said mist trap mechanism.

18. A system according to claim 1, wherein
said impurity removing liquid is cold demineralized water with a temperature of 8° C. or lower.

19. A system according to claim 1, wherein
said impurity removing liquid is demineralized water with an alkaline component concentration of less than 1 ppb.

* * * * *